US006486679B1

(12) United States Patent
Holt

(10) Patent No.: US 6,486,679 B1
(45) Date of Patent: Nov. 26, 2002

(54) WIDE-BAND RATIOMETRIC RADIO FREQUENCY BRIDGE

(76) Inventor: Kenneth David Holt, 5325 Bent Tree Forest Dr., #1137, Dallas, TX (US) 75248

( * ) Notice: Subject to any disclaimer, the term of this patent is extended or adjusted under 35 U.S.C. 154(b) by 0 days.

(21) Appl. No.: 09/683,574

(22) Filed: Jan. 21, 2002

(51) Int. Cl.[7] ............................................. G01R 27/02
(52) U.S. Cl. ...................................... 324/610; 324/706
(58) Field of Search .............................. 324/76.14, 610, 324/706

(56) References Cited

U.S. PATENT DOCUMENTS

| | | | | |
|---|---|---|---|---|
| 4,146,834 A | * | 3/1979 | Maltby et al. | 324/610 |
| 4,242,631 A | * | 12/1980 | Hall | 324/607 |
| 4,342,089 A | * | 7/1982 | Hall | 324/608 |
| 4,546,441 A | * | 10/1985 | Burch | 324/617 |
| 5,264,798 A | * | 11/1993 | Bey et al. | 324/443 |

* cited by examiner

Primary Examiner—Christine Oda
Assistant Examiner—John Teresinski

(57) ABSTRACT

A radio frequency bridge, useful for measuring complex values of an unknown impedance or associated complex reflection coefficient and VSWR value, which comprises an rf source, a novel asymmetrical bridge, a measuring device (comprising two logarithmic amplifiers, a difference amplifier and a phase detector), a computing device and a display or interface device. The complex impedance may be any two terminals of a general N-port network not to exclude an antenna with or without feed-line. The invention is more accurate than prior art when measuring complex impedance values having magnitudes from approximately five ohms to an upper value limited only by the dynamic range of the logarithmic amplifiers, normally greater than 4000 ohms. It has the great advantage of maintaining constant measuring accuracy over a wide measuring range and can be designed to operate over very wide bandwidths.

3 Claims, 6 Drawing Sheets

Asymmetrical Bridge
% Error in Measured |Zx| /45 Deg.
(Amp. Err. = 0.2dB, Phase Err. = 1 Deg.)

(a)  Ro = 50 Ohms (b)  Ro = 5 Ohms

WIDE-BAND RATIOMETRIC RADIO FREQUENCY BRIDGE

BACKGROUND OF INVENTION

1. Field of Invention

This invention relates to electronic bridge networks as used for the measuring of complex electrical impedance values comprising resistive (real) and reactive (imaginary) components.

2. Description of Prior Art

FIG. 1 illustrates a bridge configuration that is most commonly used in low cost radio frequency (rf) bridge based measuring instruments. Instruments of this type determine the complex electrical impedance magnitude ($|Z_X|$) and the associated reflection coefficient magnitude ($|\rho|$) for the complex impedance value being measured. Magnitude values for the real ($R_X$) and unsigned reactive ($X_X$) components as well as Voltage Standing Wave Ratio (VSWR), as taught by Paul's seminal U.S. Pat. No. 2,323,076 (1940), are then derived.

Referring to FIG. 1, $V_{source}$ is an alternating current (a.c.) voltage source at a frequency of interest for the measurement. $Z_X$ is a complex impedance whose value is unknown and having, in general, both resistive (real) and reactive (imaginary) components. $Z_X$ may be any two terminals of a general N-port network, not to exclude an antenna with or without feed-line. $R_O$ may, in general, be any value but is normally selected to be equal to a standard characteristic impedance, typically 50 or 75 ohms resistive. Voltages $|V_D|$, and $|V_1|$ are indicated by measuring devices $M_1$ and $M_2$ respectively, simple a.c. voltmeters with magnitude determination only. Also, measuring devices $M_3$ and $M_4$, simple a.c. voltmeters with magnitude determination only, indicate voltages $|V_B-V_2|$ and $|V_2|$ respectively. It follows that a computing device (not illustrated) could utilize the four measured values of FIG. 1 to calculate the following useful quantities:

Complex Impedance Magnitude=$|Z_X|=R_O|V_2|/(|V_B-V_2|)$,

Voltage Across the Horizontal Bridge Diagonal=$|V_D|=|V_2-V_1|$,

Reflection Coefficient Magnitude=$|\rho|=|(Z_X-R_O)/(Z_X+R_O)|=|V_D|/|V_1|$,

Voltage Standing Wave Ratio (VSWR)=$(1+|\rho|)/(1-|\rho|)$,

Resistive Component of $Z_X=R_X=\{(|Z_X|^2+R_O^2)(1-|\rho|^2)\}/\{f2R_O(1+|\rho|^2)\}$ and Unsigned Reactive Component of $Z_X=X_X=(|Z_X|^2-R_X^2)^{1/2}$ where $|Z_X|$, $R_O$, $|\rho|$, VSWR, $R_X$, and $X_X$ are real unsigned numbers.

BACKGROUND-LIMITATIONS OF THE PRIOR ART

Measuring accuracy and bandwidth for the circuit of FIG. 1 are primarily limited by measuring devices $M_1$ through $M_4$, the accuracy and purity of the resistive bridge elements and stray inductances, capacitances and resistances associated with the physical embodiment of FIG. 1. The measuring devices depicted in FIG. 1 as $M_1$ through $M_4$ typically comprise rf detection (rectification) diodes, in series with an appropriately valued capacitor, connected between the measurement nodes as illustrated in FIG. 2 and contribute to measuring error in several ways.

In FIG. 2, voltages $|V_D|$, $|V_1|$, $|V_B-V_2|$ and $|V_2|$ are developed across four capacitors, C1 through C4, respectively, after being detected by diodes D1 through D4, respectively. Not shown in FIG. 2, the detected voltages may be indicated on simple direct current (d.c.) voltmeters or converted to a digital format with an Analog to Digital Converter (ADC) for processing. The best embodiment of rf diodes D1 through D4 is based on zero bias schottky or back (tunnel) diodes, special diodes perfected for use as small signal radio frequency detectors. Even the best embodiment for the rf diodes will exhibit detection inaccuracies due to non-linear diode forward conduction characteristics, especially at small voltage levels normally experienced across the bridge horizontal diagonal ($|V_D|=|V_2-V_1|$). When detecting small voltage levels, the non-linear diode characteristics cause dead zones where no useful voltage is detected thus causing measurement drop-outs. Variations of the diode junction voltages, induced by ambient temperature fluctuations, will further add to inaccuracies in detected voltages. Forward d.c. biasing of the diodes as well as compensation for the above cited errors, in the computing device for determining $|Z_X|$, $|\rho|$, VSWR, $R_X$ or unsigned $X_X$, provides some improvement but accuracy is still severely limited for low VSWR measurements and for measuring of $|Z_X|$ values near $R_O$.

Referring again to FIG. 2, a second measuring limitation of the prior art is the loading effect and resulting measurement distortion and accuracy degradation caused by the measuring device being connected in parallel with the various bridge sides. This alters the effective value of the bridge resistances, $R_O$, and even the value of the impedance being measured, $Z_X$, in a nonlinear manner difficult to characterize for compensation purposes.

A further limitation of the prior art is the inability to determine a sign for the derived reactive component of the complex impedance being measured. Attempts have been made in prior art to overcome this shortfall by detecting a relative phase difference between ($V_B-V_2$) and $V_2$ as shown in FIG. 2. Unfortunately, connecting a phase detector across the impedance being measured produces further unwanted loading and attendant measurement distortion and accuracy degradation.

Prior art measuring accuracy of $|Z_X|$ values, due to the above limitations, is typically ±10% to ±35% for VSWRs of 2:1 or less with nominal measuring ranges of 5 to 1000 ohms. Multiple instruments are required to cover the 1 to 500 MHz frequency range and coverage above 500 MHz is not generally available. A typical ambient operating temperature range is 10 to 35 degrees Centigrade.

BACKGROUND-OBJECT AND ADVANTAGES

Accordingly, several objects and advantages of the new invention are:

(a) to provide a low-cost complex rf impedance measuring capability with improved accuracy compared to prior art, (b) to provide a low-cost complex rf impedance measuring capability with increased bandwidth compared to prior art, (c) to provide a low-cost complex rf impedance measuring capability with increased measuring range compared to prior art, (d) to provide an rf bridge in which there is negligible loading of the unknown impedance being measured by the measuring device, (e) to provide an rf bridge capability that is linear in response from low to high values of measured quantities without the dead zones associated with attempted detection of voltages below diode thresholds commonly found in prior art, (f) to increase rf bridge measuring accuracy, compared to prior art, over wider ambient temperature variations, (g) to provide for nullification of measuring device capacitive loading effects on the rf bridge and (h) to provide an rf bridge capability with constant measuring accuracy over a wide measuring range.

Further objects and advantages of the invention will become apparent from a consideration of the drawings and ensuing description.

SUMMARY OF INVENTION

My invention, a radio frequency bridge, useful for measuring complex values of an unknown impedance or associated complex reflection coefficient and VSWR value, comprises an rf source, a novel asymmetrical bridge, a measuring device (comprising two logarithmic amplifiers, a difference amplifier and a phase detector), a computing device and a display or interface device. The complex impedance may be any two terminals of a general N-port network not to exclude an antenna with or without feed-line. The invention is more accurate than prior art when measuring complex impedance values having magnitudes from approximately five ohms to an upper value limited only by the dynamic range of the logarithmic amplifiers, normally greater than 4000 ohms.

Referring again to FIG. 3, the invention employs a novel asymmetrical bridge with a measuring device, improved over prior art, to increase accuracy, bandwidth and measuring range. It has the great advantage of maintaining constant measuring accuracy over a wide measuring range. The bridge is a wide band design for complex impedance measuring, implemented in a manner to minimize bridge associated stray inductances, capacitances and resistances. The bridge may be frequency compensated, over a wide range of frequencies, to nullify the effects of the measuring device's logarithmic amplifier input capacitance.

A computing device can provide a complex value (magnitude and phase angle) as well as real values for the resistive and signed reactive component for the complex impedance being measured. A complex value for the associated reflection coefficient and a real VSWR value can also be calculated as well as other desired quantities. All computed quantities are either displayed on a display device or interfaced for subsequent processing or display.

DETAILED DESCRIPTION
DETAILED DESCRIPTION-CIRCUITRY

Figure 1:
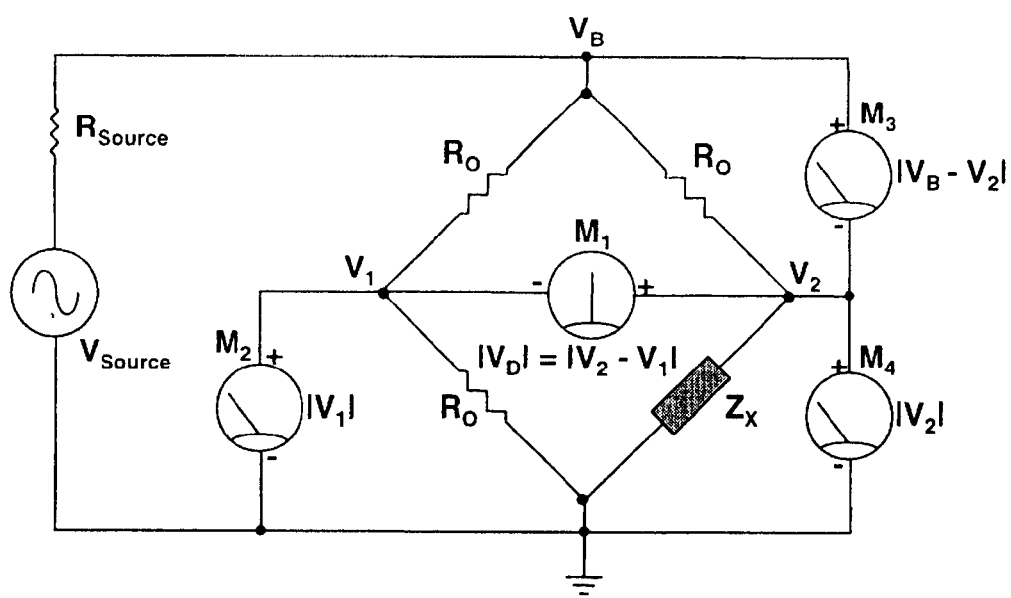
FIG. 1 illustrates, as prior art, a basic Wheatstone bridge with variable frequency a.c. voltage excitation and voltage measurements taken across the horizontal bridge diagonal and three sides of the bridge. These measurements together with a computing device, can yield values for the magnitude of the complex impedance being measured, the magnitudes of the resistive and unsigned reactive components of the complex impedance, the associated reflection coefficient magnitude and a VSWR value.
Figure 2:
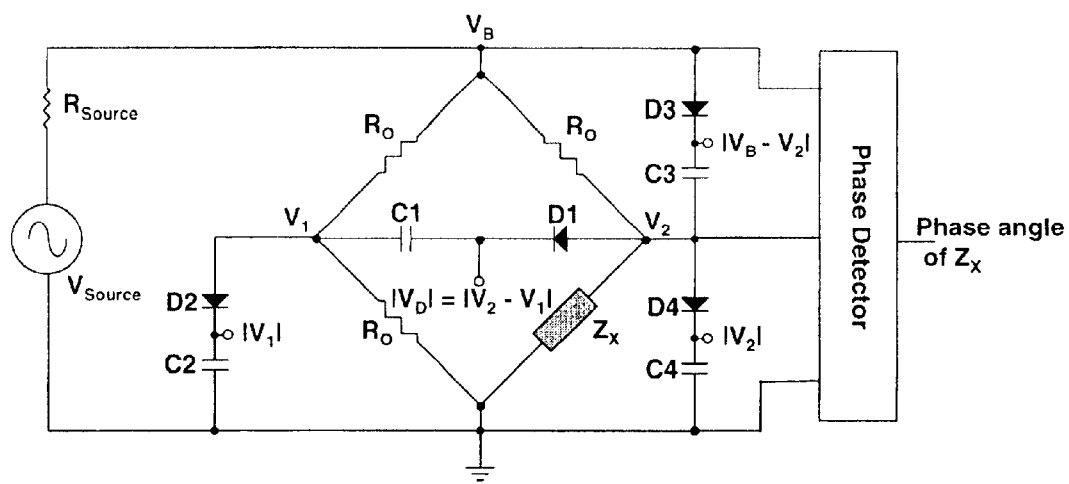
FIG. 2 illustrates prior art for the measuring device utilized in commercial radio frequency bridges.
Figure 3:
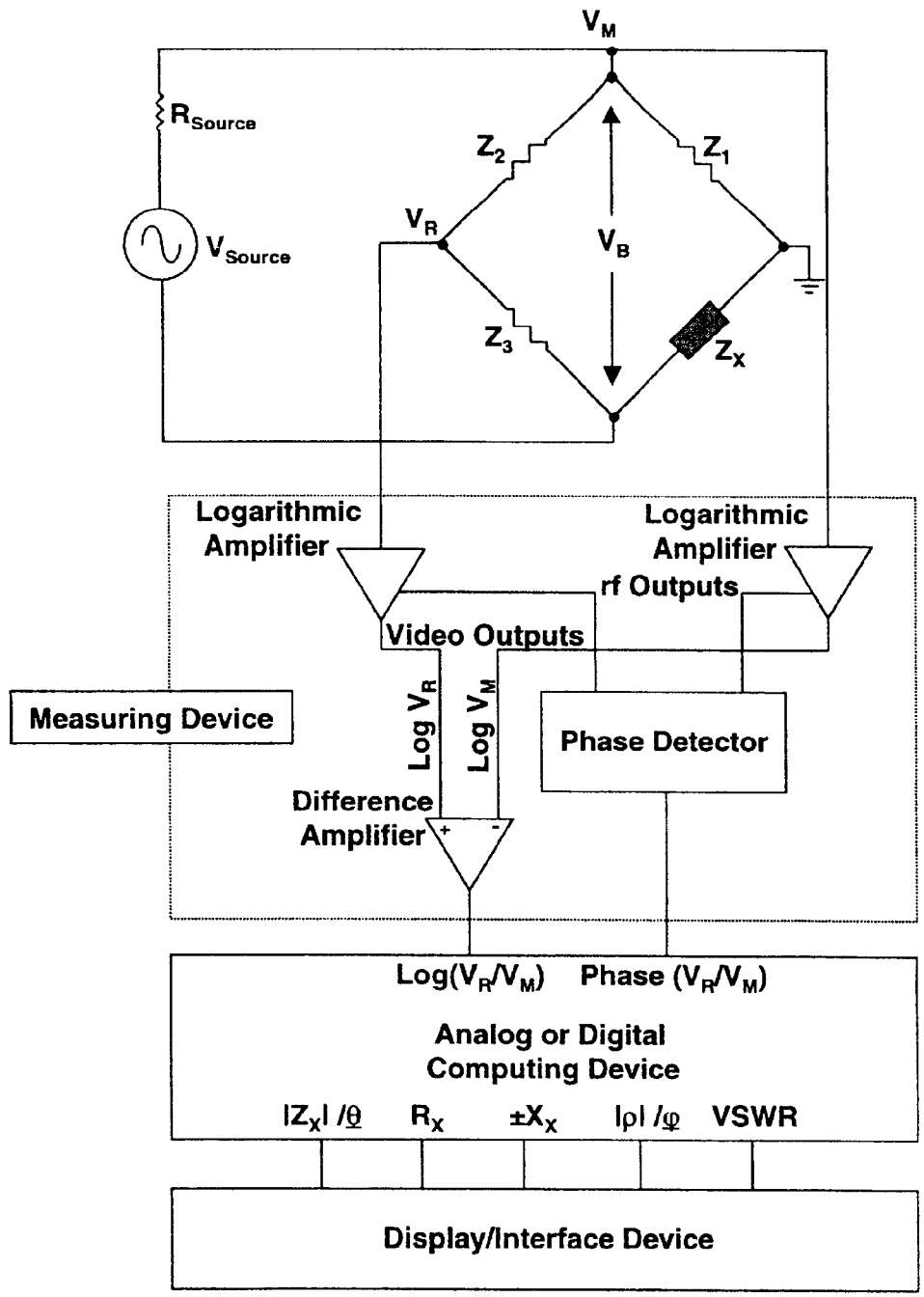
FIG. 3 illustrates the invention, comprising a novel asymmetrical bridge, an improved measuring device and computing device. Values for the magnitude and phase angle for a complex impedance being measured, values for the resistive and signed reactive components of the complex impedance and the associated complex reflection coefficient as well as a VSWR value are possible products of the invention. All computed results are displayed or interfaced to subsequent processing with a display/interface vice.

The invention, illustrated in FIG. 3, comprises an asymmetrical rf bridge, a measuring device, a computing device and a display or interface device. The bridge comprises three sides with known general impedance values ($Z_1$, $Z_2$ and $Z_3$) and a forth side containing an unknown impedance value, $Z_X$, to be measured. $Z_X$ is connected to the rf bridge circuit with a commercially available wide band rf connector of which one side is grounded, a desirable feature of this invention. In one embodiment of the invention $Z_1$ through $Z_2$ are implemented as resistors shunted by compensation capacitors. All components are selected to maintain their accuracy over a wide frequency band and wide ambient temperature range. A wide band rf source connects across the bridge vertical diagonal.

The measuring device comprises two wide band logarithmic amplifiers, a difference amplifier and a phase detector. A first logarithmic amplifier input is connected to the bridge at a left side of a bridge horizontal diagonal ($V_R$) and a second logarithmic amplifier input is connected to the bridge at a top end of a bridge vertical diagonal ($V_M$). Video outputs from the logarithmic amplifiers are connected to inputs of a difference amplifier, which has its output connected to a first computing device input. Phase detector inputs connect to limited rf outputs of the logarithmic amplifiers and a phase detector output connects to a second computing device input.

The computing device, in one embodiment, comprises a programmable microcontroller which, in turn, comprises Input/Output (I/O) circuitry, an ADC, computing/control circuitry and memory. Inputs of the computing device are connected to the outputs of the difference amplifier and phase detector in the measuring device. Outputs of the computing device connect to Display/Interface Device inputs.

The Display/Interface device, in one embodiment, comprises a Liquid Crystal Display (LCD) device with inputs connected to the computing device outputs.

DETAILED DESCRIPTION-OPERATION

Referring again to FIG. 3, an a.c. source, controlled manually or automatically to a frequency of interest for the measurement, provides a sufficient voltage, $V_B$, across the vertical diagonal of the rf bridge. Voltage $V_R$ is developed at the left end of the bridge horizontal diagonal with respect to ground. Voltage $V_M$ is developed at the top end of the bridge vertical diagonal with respect to ground. Taken together with respective magnitudes and phases, $V_R$ and $V_R$ characterize the magnitude and phase of the unknown impedance, $Z_X$. The relationship between $Z_X$ and the bridge voltages, $V_R$ and $V_M$ is $$Z_X=(Z_1/Z_2)\{Z_3-(Z_2+Z_3)V_R/V_M\}=|Z_X| \text{ with phase angle } \Theta$$

where $Z_X$, $Z_1$ through $Z_3$, $V_R$ and $V_M$ are complex numbers representing quantities having both real and imaginary components or alternatively magnitude and phase for the impedance or voltages represented. Angle $\Theta$ is the phase angle of $Z_X$. More specifically, if $Z_2=Z_3$, then $$Z_X=Z_1(1-2V_R/V_M).$$

The asymmetrical bridge provides a ratiometric indication of complex impedance $Z_X$ via the complex ratio, $V_R/V_M$. The advantage of this fact is that only two connections (exclusive of a ground connection) to the bridge are required to extract all the needed information from the bridge to compute $|Z_X|$ at phase angle $\Theta$ as well as other quantities identified below. Additionally, the invention has the great advantage of maintaining constant measuring accuracy over a wide measuring range. The a.c. source impedance does not enter into the calculation of $Z_X$, hence it can be resistive, $R_{Source}$, or complex, $Z_{Source}$.

The high input impedance (high resistance and low capacitance) logarithmic amplifiers of the measuring device covert the rf voltages $V_R$ and $V_M$ to video proportional to Log $|V_R|$ and Log $|V_M|$, respectively. The use of a measuring device with a high input impedance minimizes the measuring accuracy impact of any loading effects imposed by the measuring device. Within the measuring device, a difference amplifier operates on the logarithmic amplifier video outputs to yield a video voltage proportional to Log $|V_R/V_M|$. Also within the measuring device, a phase detector operates on limited rf outputs from the two logarithmic amplifiers to yield a video voltage proportional to the relative phase of $V_R$ and $V_M$ denoted as Phase($V_R/V_M$).

From the relationship between $Z_X$ and $V_R/V_M$ it may be deduced that logarithmic amplifiers having a minimum dynamic range of approximately 60 dB are required for measuring of impedance values between approximately 1 and 4000 ohms with acceptable accuracy. Other measuring ranges will require more or less logarithmic amplifier dynamic range. Since any amplitude offset or scale factor differences between the. logarithmic amplifiers will result in measurement errors, it is desirable to keep amplitude offsets and scale factor differences at a minimum. Likewise, it is desirable to keep the phase detector errors (offset and scale factor) to a minimum. A suitable candidate for the measuring device is available commercially, as an integrated circuit, having nominal amplitude errors of 0.2 dB and nominal phase errors of 1.0 degree over a 60 dB dynamic range and possessing an operating bandwidth of approximately 2.7 GHz. The device maintains its performance over a 40 to 85 degrees Centigrade range of ambient operating temperatures. Alternatively, an arrangement of discrete devices could perform the measuring device function.

Bandwidth of the invention is limited by the specific design of the bridge, and resulting magnitudes of unwanted stray resistances, capacitances and inductances, as well as the measuring device's logarithmic amplifier bandwidth and the frequency source bandwidth. Bridge bandwidth can be maximized, if desired, through the use of miniature through-hole components or surface mount technology (SMT) components and ultimately by combining the bridge circuit and wide bandwidth measuring device on one integrated or hybrid circuit. Additionally, a means for frequency compensation could be utilized with the bridge to nullify logarithmic amplifier input capacitance as well as stray resistances, capacitances and inductances. The frequency compensation means could comprise capacitors or other passive or active components or component combinations connected across selected bridge sides. With proper bridge frequency compensation, measuring bandwidth is limited only by the measuring device and frequency source.

Referring again to FIG. 3, a computing device based on well known analog or digital techniques, operates on the Log $|V_R/V_M|$ and Phase ($V_R/V_M$) inputs to produce the polar, rectangular or real representation of desired output quantities that can be derived from $|Z_X|$ with phase angle $\Theta$. One embodiment of the computing device is a low cost microcontroller device, commercially available, having an integral ADC capability and thus capable of interfacing directly to the measuring device. An example of possible calculations are:

$V_r/V_M$=Antilog (Log $|V_R/V_M|$) with phase equal to measured Phase ($V_R/V_M$).

$Z_X=Z_1(1-2V_R/V_M)=|Z_X|$ with phase angle $\Theta$, $R_X=|Z_X|\cos \Theta$, $X_X=|Z_X|\sin \Theta$, $\rho=(Z_X-R_O')/(Z_X+R_O')=|\rho|$ with phase angle $\phi$, and VSWR=$(1+|\rho|)/(1-|\rho|)$ where $V_R$, $V_M$, $Z_1$, $Z_X$ and $\rho$ are complex numbers, VSWR, $R_X$ and $X_X$ are real signed numbers and $R_O'$ is the characteristic impedance for the system in which $\rho$ and VSWR values are desired. Angles $\Theta$ and $\phi$ are the phase angles of $Z_X$ and $\rho$, respectively.

Again referring to FIG. 3, a display/interface device, based on well known analog, digital and display techniques, operates on the outputs of the computing device to display, condition or interface any quantity calculated by the computing device to man or machine. One embodiment of the Display/interface device is a commercially available low cost graphic LCD display capable of displaying both numeric and graphic data.

Figure 4:
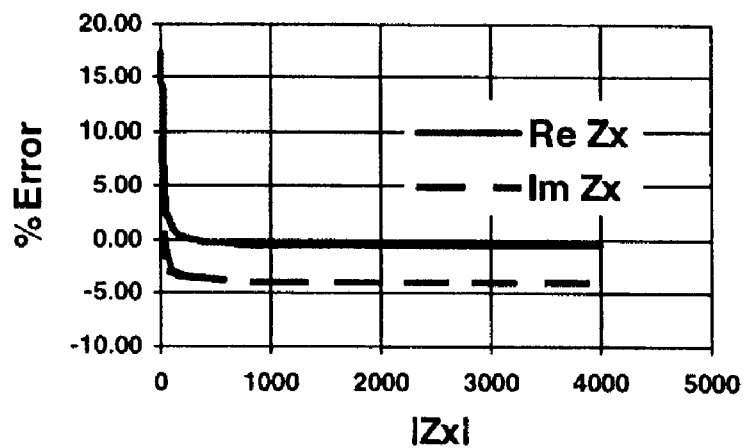
FIG. 4. illustrates, for $Z_1=Z_2=Z_3=R_O=50$ ohms resistive, typical accuracy of the asymmetrical bridge as $Z_X$ varies over a wide range of values (approximately 0–4000 ohms). A nominal measuring device amplitude and phase error of 0.2 dB and 1.0 degree, respectively, was used in the accuracy determination. The phase angle of $Z_X$ was held constant at 45 degrees to facilitate a measurement accuracy determination for equal resistive and reactive components of $Z_X$.

Measuring accuracy of the invention is dominated by practical phase and amplitude errors in the measuring device. Errors from a commercially available measuring device, the bridge and other sources can be controlled through careful design to approximately 0.2 dB in amplitude and 1.0 degree in phase. FIG. 4 shows, with $Z_1=Z_2=Z_3=R_O=50$ ohms resistive, the invention's measuring errors in the resistive (real) and reactive (imaginary) components of a complex impedance ranging from approximately zero to 4000 ohms magnitude and having a phase angle of 45 degrees (equal resistive and reactive components). The invention has the great advantage of maintaining constant measuring accuracy over a wide measuring range and offers a significant improvement in accuracy over the cited prior art for all values of $Z_X$. As logarithmic amplifiers with smaller errors become available, accuracy over the entire measuring range may be improved. Ultimate accuracy is limited by how small measuring device errors can be made as well as computing device ADC resolution, if used.

Figure 5:
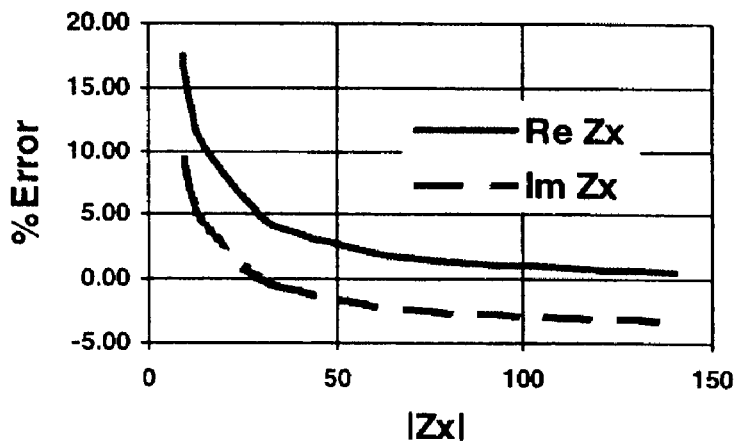
FIG. 5 compares the accuracy of the asymmetrical bridge, when measuring low values of $Z_X$, for $Z_1=Z_2=Z_3=R_O=50$ or 5 ohms resistive. The accuracy of the asymmetrical bridge, for lower values of $Z_X$, improves as $R_O$ is decreased.
Figure 5:
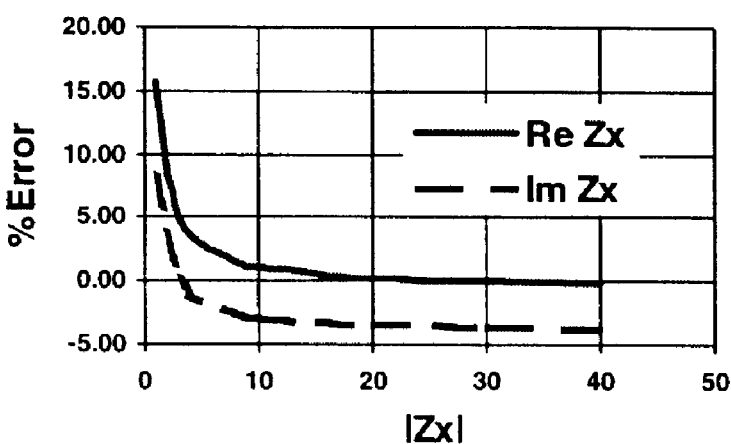

FIG. 5 shows the effect of decreasing $Z_1=Z_2=Z_3=R_O$ from 50 to 5 ohms resistive for the invention and indicates that lower values of $R_O$ result in better measuring accuracy at lower $Z_X$ magnitudes. Operation of the bridge with values of $Z_1$ through $Z_3$ being other than a standard characteristic impedance value such as 50 or 75 ohms resistive, is not a limitation of the invention. Impedance, reflection coefficient or VSWR in a system of any characteristic impedance can be determined with a wide range of values for $Z_1$ through $Z_3$ since the measuring of $Z_X$ is independent of the bridge impedance with this invention. However, with $Z_2=Z_3$, calculations are more convenient. Note also that a specific system characteristic impedance value is used for computing the reflection coefficient and VSWR, as described above, after $Z_X$ is measured.

Figure 6:
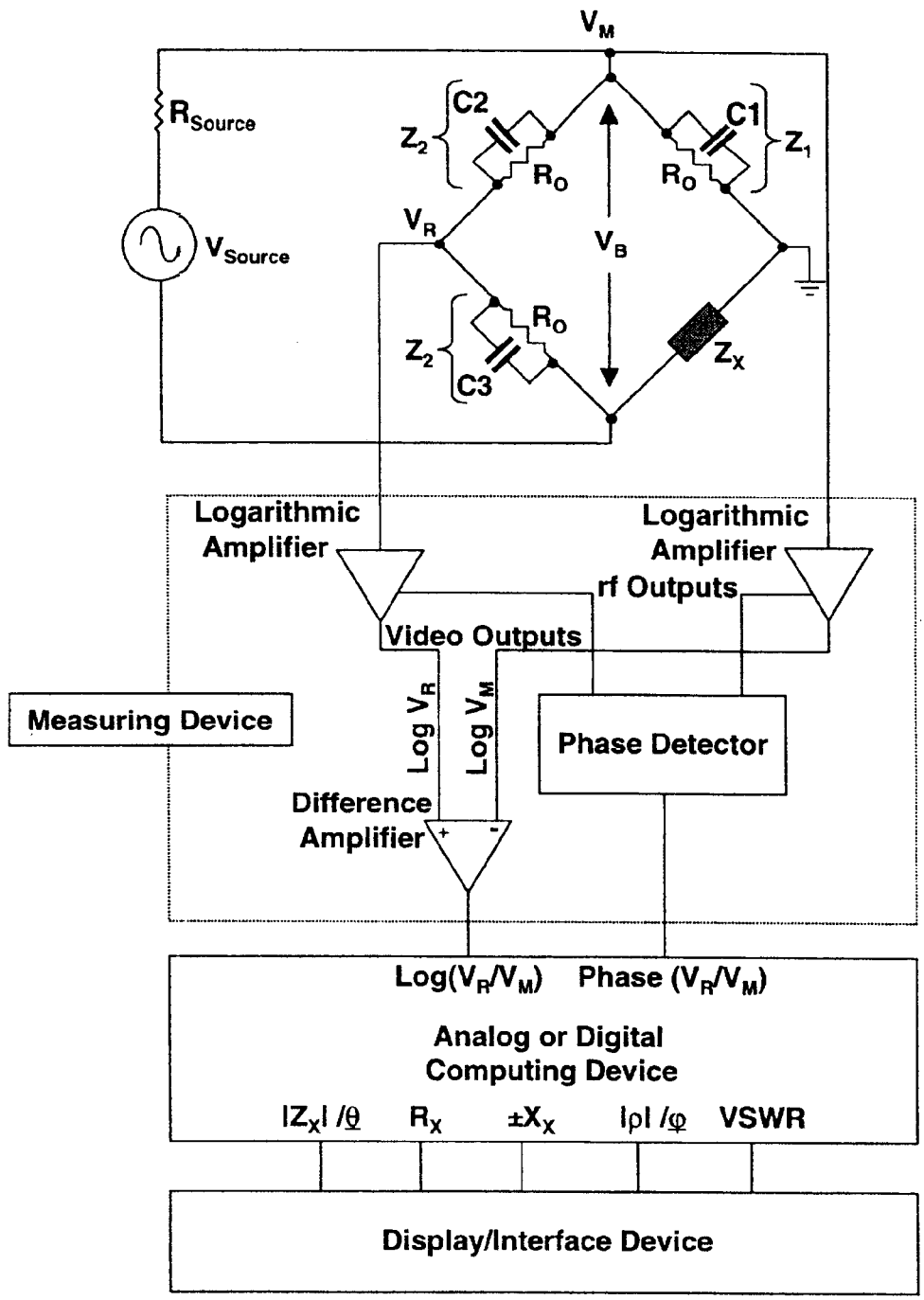
FIG. 6 illustrates a method by which the resistive form of the asymmetrical bridge may be compensated for capacitive loading effects of the measuring device's logarithmic amplifiers.

A very specific and useful implementation of the general bridge results when $Z_1$ through $Z_3$ of FIG. 3 comprise three equally valued resistors denoted by $R_O$, each shunted by a capacitor, denoted as C1 through C3 as illustrated in FIG. 6. Such an arrangement is useful in optimizing the bandwidth of the invention. $R_O$ is selected to be very small compared to the input resistance of the measuring device's logarithmic amplifiers to minimize loading effects. The values of C1 through C3 are selected, in conjunction with the input capacitance of the measuring device's logarithmic amplifiers, to equalize the net capacitance across each leg of the bridge, exclusive of the leg containing the unknown impedance, $Z_X$. The bridge arrangement of FIG. 6, with appropriate values of C1 through C3 thus provides for $Z_2=Z_3$ as well as $Z_X=Z_1 (1-2V_R/V_M)$ over a very wide range of frequencies.

DETAILED DESCRIPTION-CONCLUSIONS, RAMIFICATIONS AND SCOPE OF INVENTION

The described invention provides a low cost approach to improve, over prior art, measuring accuracy, bandwidth, range of measurable impedance values and ambient temperature operating range when measuring unknown complex impedance values. The bridge design provides for one side of the unknown impedance, $Z_X$, to be grounded, which is desirable in most high frequency measurements, and minimizes any undesirable loading effects across $Z_X$. The unique asymmetrical design of the bridge has the great advantage of maintaining constant measuring accuracy over a wide measuring range. The measuring device for the invention eliminates measurement drop outs common in prior art. Additionally, the bridge can be simply compensated to nullify the effects of the measuring device's logarithmic amplifier input capacitance thus optimizing bandwidth of the invention.

Although the description above contains many specificities, these should not be construed as limiting the scope of the invention but merely providing illustrations of some of the presently preferred embodiments of the invention. For example, the bridge impedance values, $Z_2$ and $Z_3$ could comprise pure capacitive values, display technologies other than LCD devices could be used or the computing device could calculate other quantities such as transmission line loss. In addition, the schematic representation or physical embodiment of the invention could be electrically equivalent but have a different appearance from that illustrated in FIG. 3 and FIG. 6. Thus, the scope of the invention should be determined by the appended claims and their legal equivalents, rather the by the examples given.

I claim:

1. An rf bridge, comprising four sides positioned symmetrically around a vertical diagonal and a horizontal diagonal; said diagonals being mutually bisecting and forming reference positions only for said sides of said rf bridge, said sides which are adjacent being connected; a means for series connecting an unknown impedance value, $Z_X$, in a one of said sides between a right end of said horizontal diagonal and a bottom end of said vertical diagonal; a set of three general and known impedance values with one each of said general and known impedance values series connected in three of said sides not containing said unknown impedance value, $Z_X$; a ground connected to said rf bridge at said right end of said horizontal diagonal; an a.c. voltage source having a variable frequency, and arbitrary internal impedance, connected to said rf bridge between a top end and said bottom end of said vertical diagonal; a measuring means comprising two logarithmic amplifiers with inputs connected, one each, to said rf bridge at a left end of said diagonal and said top end of said vertical diagonal, a difference amplifier with inputs connected, one each, to video outputs of said logarithmic amplifiers, and a phase detector with inputs connected, one each, to rf outputs of said logarithmic amplifiers.

2. Said rf bridge and said measuring means of claim 1 with said difference amplifier and said phase detector outputs of said measuring means connected to inputs of a computing means and outputs of said computing means connected to inputs of display or interface means.

3. Said rf bridge and said measuring means of claim 1 with said general and known impedance values made equal to $R_O$, a resistive value, and frequency compensation means connected in parallel with a plurality of said $R_O$ resistive values.

* * * * *